United States Patent [19]

Stockinger

[11] Patent Number: 4,890,012

[45] Date of Patent: Dec. 26, 1989

[54] AN INTEGRATED CONTROLLED FET SWITCH

[75] Inventor: Josef Stockinger, Munich, Fed. Rep. of Germany

[73] Assignee: SGS-Thomson Microelectronics GmbH, Munich, Fed. Rep. of Germany

[21] Appl. No.: 199,836

[22] Filed: May 27, 1988

[30] Foreign Application Priority Data

May 27, 1987 [DE] Fed. Rep. of Germany ....... 3717922

[51] Int. Cl.⁴ ............................................ H03K 17/16
[52] U.S. Cl. .................... 307/296.5; 307/448; 307/451; 307/576; 307/585; 361/91
[58] Field of Search ............... 307/200 B, 448, 296 R, 307/451–452, 576–577, 579, 584, 585, 243; 361/91, 100

[56] References Cited

U.S. PATENT DOCUMENTS

| | | | |
|---|---|---|---|
| 3,305,709 | 2/1967 | Thyomas et al. | 307/584 |
| 3,521,141 | 7/1970 | Walton | 307/577 X |
| 3,558,921 | 1/1971 | Yokozawa et al. | 307/577 |
| 3,789,244 | 1/1974 | Provanzano | 307/579 |
| 4,449,118 | 5/1984 | Dingwall et al. | 307/451 X |
| 4,473,761 | 9/1984 | Peterson | 307/579 |
| 4,544,854 | 10/1985 | Ulmer et al. | 307/576 |
| 4,752,704 | 6/1988 | Baccarani et al. | 307/576 X |

FOREIGN PATENT DOCUMENTS

| | | | |
|---|---|---|---|
| 0091265 | 10/1983 | | |
| 0013029 | 1/1983 | Japan | 307/577 |
| 0242721 | 12/1985 | Japan | 307/576 |

OTHER PUBLICATIONS

Thibodeaux, "Getting the Most Out of CMOS Devices for Analog Switching Jobs", Electronics, Dec. 1975, pp. 69–74.

Designing with Field Effect Transistors, Siliconix, Inc., ed. by A. Evans, McGraw-Hill Book Co., New York, 1981, pp. 207–219.

Walt Heinzer: "Digitales Schalten von Analogsignalen mit dem DG308A".

Peter Wurll: "Ein Vollelektronischen Analogschalter mit Studioqualitätsdaten In MOS-Technik Für Dynamische...".

Primary Examiner—David Hudspeth
Attorney, Agent, or Firm—Spencer & Frank

[57] ABSTRACT

A switch means designed as an integrated circuit possesses two series-connected FETs (Q1P, Q2P; Q1N, Q2N) whose common switching point (N5, N6) is clamped via a clamp FET (Q3N, Q3P) to a reference potential. The conductivity type of the clamp FET (Q3N, Q3P) is opposite the conductivity type of the two series-connected FETs (Q1P, Q2P; Q1N, Q2N). In the case of an n-channel clamp FET (Q3N), the latter is connected to negative potential. In the case of a p-channel clamp FET (Q3P), it is connected to positive potential.

20 Claims, 5 Drawing Sheets $V_{SUBSTRATE} = VDD$ $V_{N1} \approx VDD+0,9V$ $V_{OUT} < VDD$

AN INTEGRATED CONTROLLED FET SWITCH

The present invention relates to a switch means designed as an integrated circuit comprising a first controllable switch in the form of a first FET which switches off completely only within a predetermined input voltage range and which, upon receiving a control signal, connects through an input signal, whereby a second controllable switch in the form of a second FET is provided between the first FET and the output of the switch means, said second switch being controlled in synchronism with the first FET, and whereby a third FET serving as a clamp FET is provided between the two FETs which in the conductive state puts the node between the first and second FETs at constant voltage and is switched in time synchronism with the first FET and the second FET to a state opposite that of the first FET and the second FET.

Such switch means are suitable, for example, for multiplexers, in particular for use in analog-to-digital converters.

As an integrated circuit, the multiplexer is formed on a chip whose voltage supply is characterized by two limiting potentials, e.g. a positive potential ($V_{DD}$) of a few volts, on the one hand, and a ground potential ($V_{SS}$) of zero volts, on the other hand.

One must ensure that the switch means, when it is nonconductive, passes no signal to the output. It has become apparent that crosstalk often occurs in multiplexers having an analog-to-digital converter connected thereto. This means that the signal in an open channel whose switch means is conductive is subject to interference coming from other channels which are in principle nonconductive.

It is known from U.S. Pat. No. 4,544,854 that such interference can be due to the fact that field-effect transistors have leakage currents in the operating range in which they are supposed to be off, whereby these currents are also very dependent on temperature. These leakage currents can be explained by the logarithmic characteristic of field-effect transistors, due to which even small currents flow in the off region, namely the leakage currents. In the analog switch shown in U.S. Pat. No. 4,544,854, the influence of leakage current interference is eliminated due to each analog switch having two series-connected switching transistors and the voltage at the common output of all channels being fed back to the connection point between the two transistors of each closed channel. This gives rise to zero voltage across the transistor located on the output side of the particular channel, so that there is no influence on the signal of the particular conductive channel.

Another unwanted signal source is capacitive or dielectric currents which arise across nonconductive field-effect transistors and lead to undesirable output signals on nonconductive channels. This interference phenomenon is dealt with by European Pat. No. A1-0091265, which discloses a switch means having the features stated at the outset. The measure described in this publication is based on the finding that, via the source-to-drain capacity of a nonconductive field-effect transistor, an alternating signal present at the input reaches through to the output in undesirable fashion. In the switch means disclosed in this publication, this effect is counteracted by each channel having two series-connected field-effect transistors and the connection point between these two field-effect transistors (FETs) being connected via a clamp field-effect transistor (clamp FET) to a constant potential, preferably ground. In the nonconductive state of the two FETs the clamp FET is made conductive so that disturb signals that have been passed via the source-to-drain capacity of the first FET are shorted to ground.

In spite of these known interference suppressing measures, considerable interference can occur when the input signal of the switch means goes beyond one or the other end of the power supply or operating voltage range.

The invention is based on the problem of remedying such interference due to the input signal exceeding the operating voltage range.

A solution to this problem involves the features that the first FET and the second FET are of the same conductivity type and the clamp FET is of the opposite conductivity type, the gate electrodes of all three FETs are driven by control signals of the same polarity, and clamping is effected to the negative operating voltage if the clamp FET is the n-channel type, and to the positive operating voltage if the clamp FET is the p-channel type.

Advantageous developments of the invention are stated in the subclaims.

An essential step in arriving at the inventive solution for overcoming such interference was the finding that this type of interference is due to parasitic bipolar effects in field-effect transistors. These bipolar effects shall now be explained with reference to FIG. 1, which shows a chip cross-section of a p-channel MOS transistor. Source S and drain D are each formed by a p+ zone located in an n-conducting substrate. Between source S and drain D there is a channel which is controlled via the potential of gate electrode G. The source electrode is connected via a terminal N1 to the input of the switch means. The drain electrode is connected to an output OUT1 of the switch means. Via control terminal C, the MOS transistor is made conductive or nonconductive. Between the source zone, substrate and drain zone a parasitic bipolar transistor is formed, which is shown by dashed lines in FIG. 1. The source forms the emitter of a p-n-p bipolar transistor, the drain forms the collector and the substrate forms the base. Since the substrate of such a p-channel MOS transistor is located on the positive potential $V_{DD}$, this bipolar transistor is not conductive when the input voltage does not exceed the operating voltage $V_{DD}$. However, when the input voltage rises above $V_{DD}$ by more than the threshold voltage of a bipolar transistor, the bipolar transistor passes into the conductive state as long as a voltage smaller than $V_{DD}$ is supplied at output OUT1 from another channel. The disturb signals caused by such bipolar effects usually have a strength considerably greater than that of disturb signals due to leakage currents and capacitive coupling.

In switch means built up with n-channel FETs, the same disturbing bipolar effects occur when the input voltage exceeds the operating voltage on the negative side and a voltage is impressed on the output side by other channels which is more positive than the voltage present at the base of the parasitic bipolar transistor.

The reason why interference due to the input signal exceeding the operating voltage range is not eliminated in the known switch means of European Pat. No. A1-0091265, can be explained as follows.

As is generally known, n-channel FETs are used to connect to negative potential, while p-channel FETs are used to connect to positive potential. This avoids a voltage drop with the value of the on-state threshold voltage which would occur if FETs of opposed conductivity were used. For this reason it only makes sense to design the clamp transistors as an n-channel FET in the circuit disclosed in European Pat. No. A1-0091265. Since the clamp FET is made conductive when the series-connected FETs are nonconductive, and vice versa, while a control signal complementary to that of the clamp FET is applied to the gate electrodes of the series-connected FETs, the series-connected FETs must also be n-channel FETs. Using p-channel FETs, one could only achieve imperfect shorting to ground of the connection point between the two series-connected FETs since one would in reality only obtain clamping to a potential that is higher than ground by the on-state threshold voltage (about 1 to 2 V).

FIG. 2 is a cross-sectional view of a field-effect transistor structure showing the parasitic bipolar structure. Referring to the upper channel with series-connected FETs 21-0 and 22-0 in FIG. 2 of European Pat. No. A1-0091265, the left FET with source S1 and drain D1 in FIG. 2 corresponds to FET 21-0 while the structure with source S2 and drain D2 corresponds to FET 22-0. The electrically common switching point of D1 and D2 is grounded via clamp FET 23-0.

In the case of an n-channel FET structure, the substrate is usually put at the negative operating voltage potential. If the signal voltage occurring at the input of the switch means is lower than the negative operating voltage potential by the emitter-to-base forward voltage of a bipolar transistor, the parasitic bipolar transistor can be conductive at corresponding collector potential. If a potential that is more positive than the negative operating voltage potential present at the base of the parasitic bipolar transistor is impressed on the output of the switch means by another channel, the bipolar transistor with emitter E being identical to S1, base B being identical to the substrate and collector K2 being identical to D2 passes into the conductive state, so that a corresponding disturb signal occurs at the output of the switch means. The bipolar structure has a further collector K1 which is identical to D1 or S2 and is put at ground potential, i.e. the negative operating voltage potential, via n-FET 23-0 in the off state of the switch means. At this potential, collector K1 has no extraction effect so that the total bipolar current reaches collector K2 and thus, undesirably, the output of the switch means.

RUNDFUNKTECHNISCHE MITTEILUNGEN, vol. 20, no. 6, Dec. 1976, pp. 247–153, discloses an analog switch built up in the same way as the switch means of European Pat. No. A1-0091265, although all transistors are formed by p-channel FETs. For such a switch means the corresponding semiconductor structure is shown in FIG. 3. Semiconductor zones corresponding to those in the structure of FIG. 2 are provided here with the same reference numbers. In such a p-channel structure the substrate is at positive operating voltage potential. If the input voltage becomes higher than the positive operating voltage potential by the amount of the emitter-to-base forward voltage of a bipolar transistor, the emitter-to-base diode of the bipolar structure is conductive. If the potential impressed on collector K2 of the bipolar structure by another channel is lower than the positive operating voltage potential, a conductive bipolar transistor E, B, K2 arises. Via p-channel clamp FET 23-0 a potential higher than the negative operating voltage potential by on-state threshold voltage $U_T$ of FET 23-0 is applied to K1 in the nonconductive state of the switch means. This means that bipolar transistor E, B, K1 is also conductive. This reduces the current extracted by collector K2, but the current occurring at the collector K2 is still great enough to cause considerable interference at the output of the switch means.

These problems have been eliminated by the present invention. Since the clamp FET, according to the invention, is of a conductivity type opposite that of the two series-connected FETs, the collector current of the parasitic bipolar structure is always derived completely via the clamp FET and virtually no output current flows at collector K2.

In the following, embodiments of the invention shall be explained in more detail with reference to the drawing, in which FIG. 1 shows a sectional view of a p-channel MOS transistor with a parasitic bipolar transistor;

Figure 4:
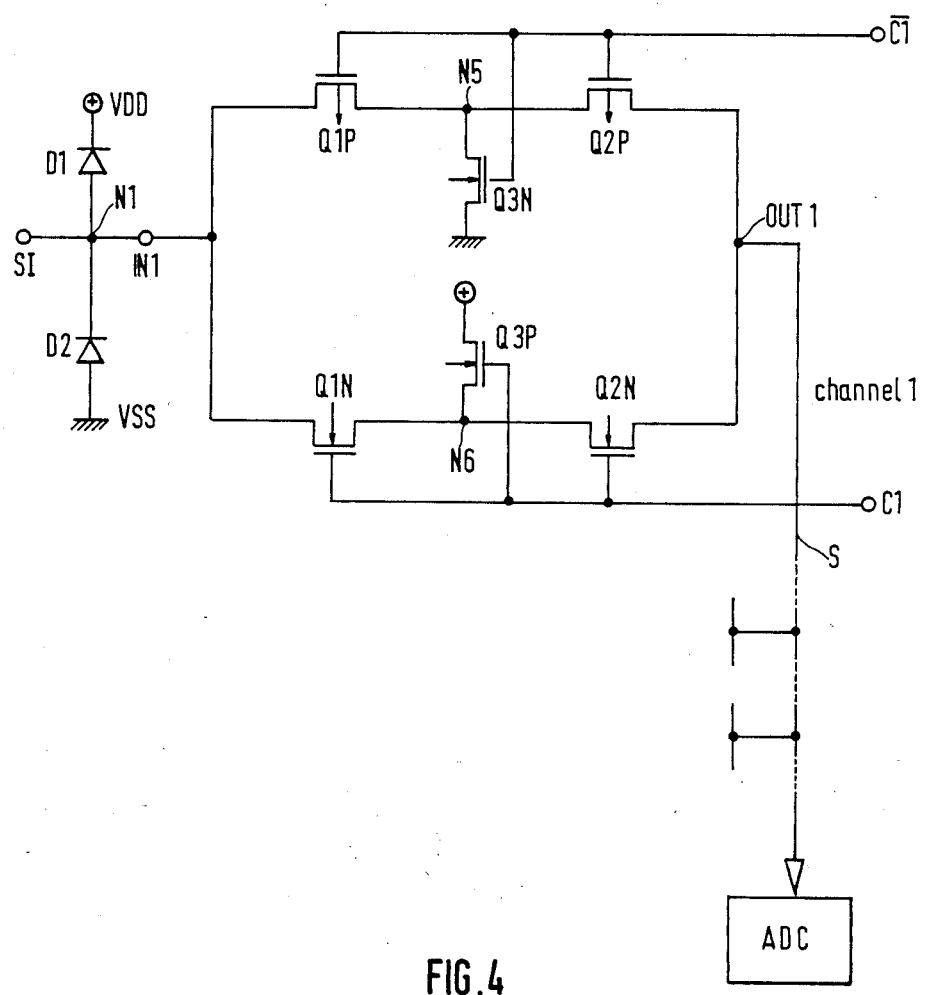
FIG. 4 shows a circuit diagram of a first preferred embodiment of the invention.
Figure 7:
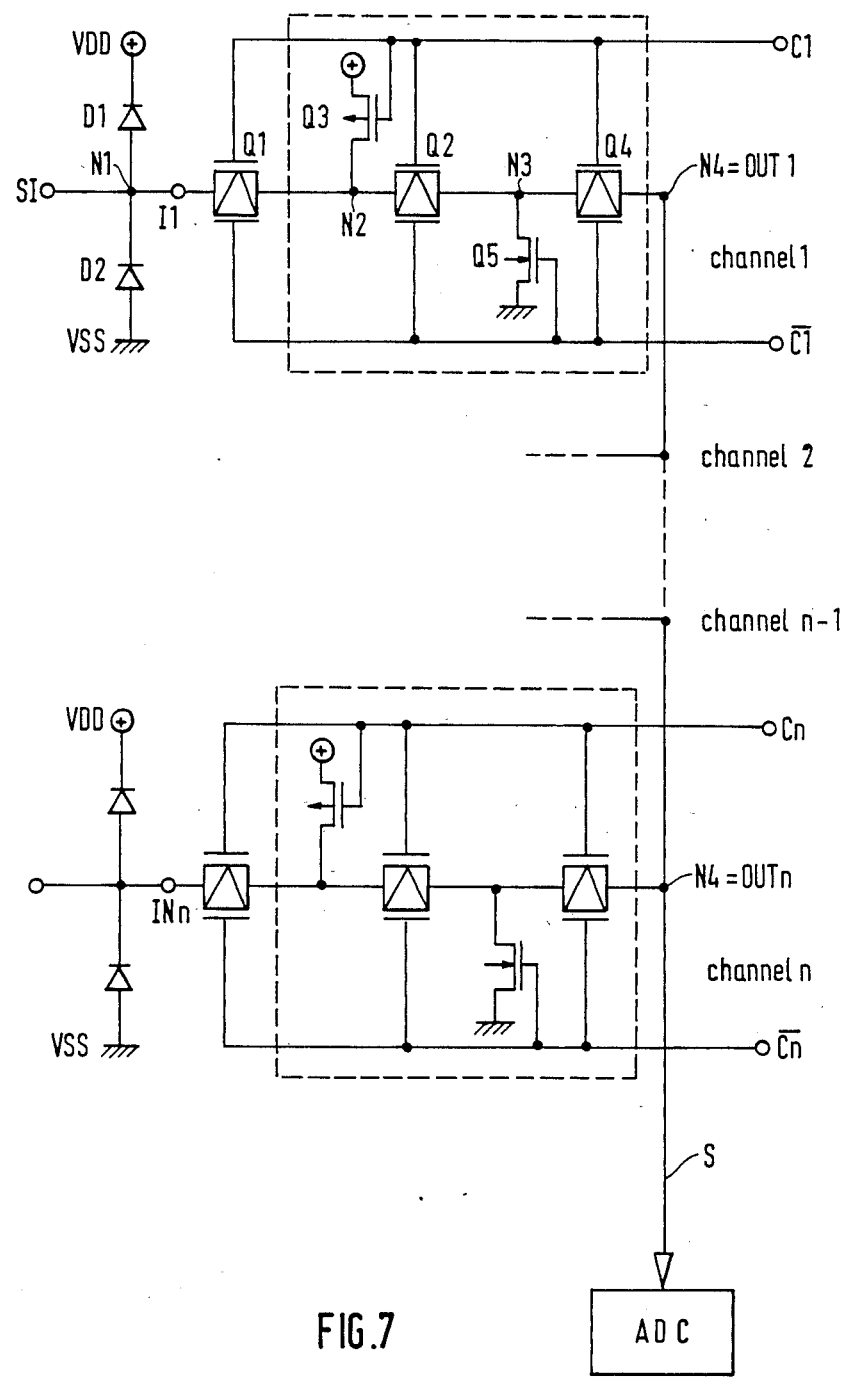
FIG. 7 shows the circuit diagram of a second preferred embodiment of the invention.

The analog signal multiplexer explained in more detail in the following with reference to FIGS. 4 and 7 is formed monolithically on a chip, the chip being connected to a supply voltage source which delivers the positive potential $V_{DD}$ and the ground potential $V_{SS}$. The multiplexer is particularly suitable for analog-to-digital converters (ADCs) but is also suitable for other applications.

The multiplexers shown in FIGS. 4 and 7 contain n channels, FIG. 4 showing only the first channel and FIG. 7 showing only the first and last channels. The channels not shown are constructed identically to those shown. Therefore, only the first channel will be described and considered in the following in each case.

In the embodiment shown in FIG. 4, each channel has a switch means with two parallel signal branches. The switch means of channel 1 has an input IN1 which forms together with a signal input SI a first node N1 to which a diode protection network with two series-connected diodes D1 and D2 is connected. The diode protection network is connected between the positive potential $V_{DD}$ and the ground or negative potential $V_{SS}$ of an operating voltage source.

Between input IN1 and an output OUT1 of channel 1 there are the two signal branches of the switch means. The upper signal branch in FIG. 4 has two series-connected p-channel FETs Q1P and Q2P. The lower signal branch in FIG. 4 has two series-connected n-channel FETs Q1N and Q2N. A connection point N5 between Q1P and Q2P is grounded via an n-channel clamp FET Q3N. A connection point N6 between Q1N and Q2N is connected to $V_{DD}$ via a p-channel clamp FET Q3P. The control electrodes of the three FETs Q1N, Q2N, Q3P of the lower signal path are jointly connected to a control signal source C1, and the control electrodes of the three FETs Q1P, Q2P, Q3N of the upper signal branch are connected to a control signal source $\overline{C1}$ whose control signals are complementary to those of control signal source C1.

The following features are essential to the invention:
the two series-connected FETs of each signal branch are of the same conductivity type;
the clamp FET of each signal branch is of a conductivity type opposite the conductivity type of the two associated series-connected FETs;
the n-channel clamp FET connects the node between the associated series-connected FETs to ground or the negative potential of the operating voltage source;
the p-channel clamp FET connects the node between the two associated series-connected FETs to the positive potential of the operating voltage source.

The circuit shown in FIG. 4 functions as follows.

At signal inputs SI of the individual channels there are analog signals to be connected through to an analog-to-digital converter ADC. With the aid of the control signals fed to the control electrodes of the FETs, each channel is made conductive during a time span reserved for it, while the other channels are nonconductive. When the analog signal from input IN1 of channel 1 reaches output OUT1, which is connected to the outputs of all other channels and to the input of the ADC, the other channels are nonconductive.

Diode protection network D1, D2 protects the switch means from positive and negative overvoltages. If the analog signal on the input side exceeds the positive potential $V_{DD}$ of the operating voltage by a certain value, diode D1 becomes conductive, whereby there drops at diode D1 its forward voltage of about 0.7 to 0.9 V. If the analog signal on the input side falls below the negative potential $V_{SS}$ of the operating voltage source by a certain value, diode D2 becomes conductive, whereby there drops at diode D2 also its forward voltage of about 0.7 to 0.9 V. During the time span when channel 1 is selected, FETs Q1P, Q2P and Q1N, Q2N are conductive in both signal branches and the two clamp FETs Q3N and Q3P are nonconductive, so that the analog signal fed to input IN1 reaches the ADC via output OUT1. If channel 1 is not selected, clamp FETs Q3N and Q3P are made conductive.

Figure 2:
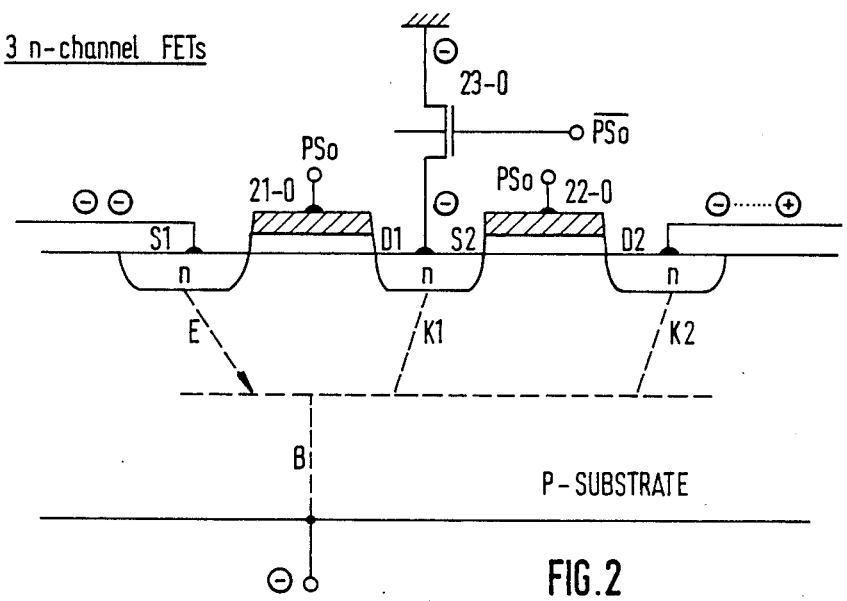
FIG. 2 shows a sectional structure of two series-connected n-channel MOS transistors with a parasitic bipolar structure.
Figure 3:
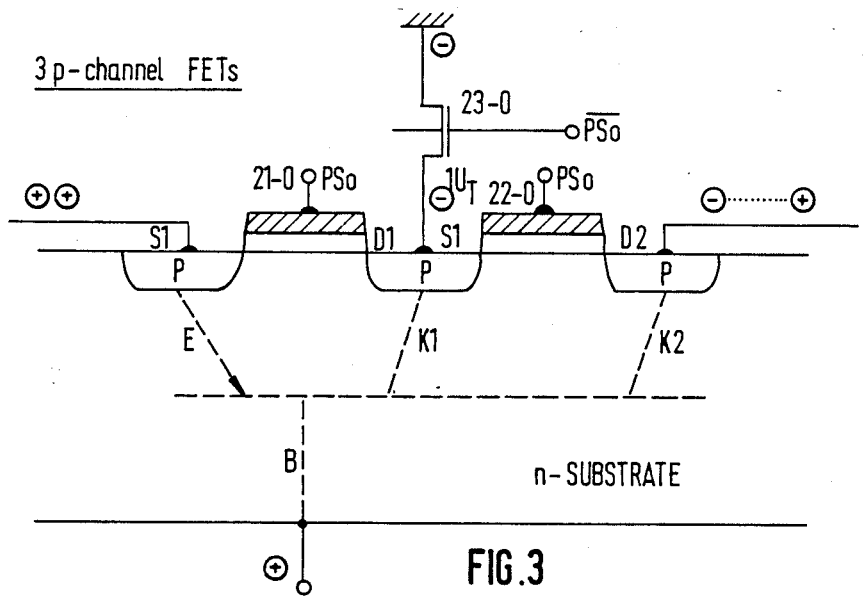
FIG. 3 shows a sectional view of two series-connected p-channel MOS transistors with a parasitic bipolar structure.

The effect of the inventive measures shall now be explained with reference to FIG. 5 for the upper signal path in FIG. 4 and with reference to FIG. 6 for the lower signal path in FIG. 4. The same reference numbers as in FIGS. 2 and 3 are used for the same feature.

Figure 5:
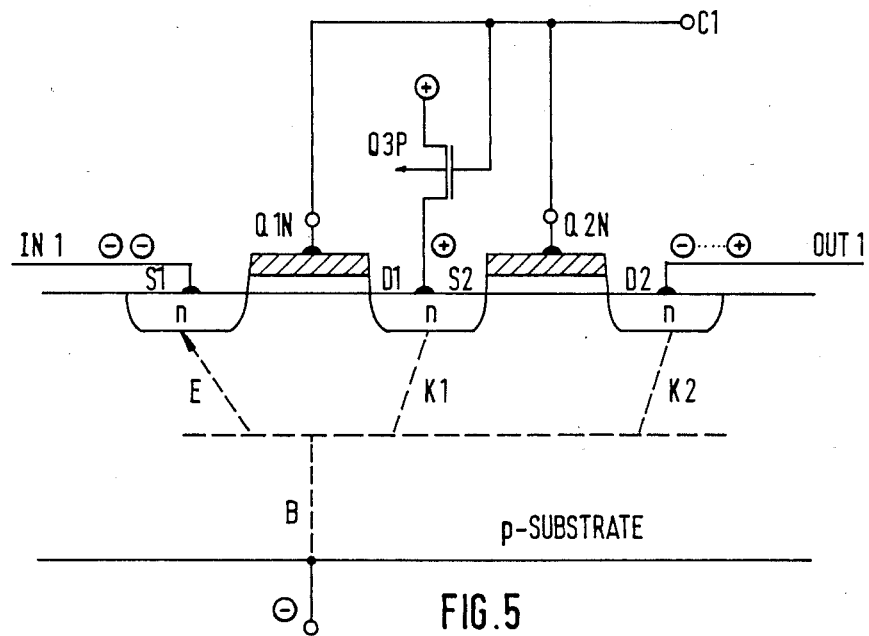
FIG. 5 shows a sectional structure of the two lower series-connected n-channel FETs of FIG. 4 with the parasitic bipolar structure.

FIG. 5 shows the cross-section of a semiconductor structure with the two n-channel FETs Q1N and Q2N of the lower signal path in FIG. 4. The p-conducting substrate forms the base of the parasitic bipolar structure and is usually at ground potential or negative potential $V_{SS}$ of the operating voltage source. n-conducting source S1 of FET Q1N forms the emitter of the parasitic bipolar structure. The latter has two collectors K1 and K2, collector K1 being formed by the n-conducting zone which forms, on the one hand, drain D1 of Q1N and, on the other hand, the source S2 of Q2N. Second collector K2 is formed by n-conducting drain zone D2 of Q2N. The parasitic bipolar structure thus forms a p-n-p transistor with two collectors.

When FETs Q1N and Q2N are nonconductive, collector K1 is on positive potential $V_{DD}$ of the operating voltage source via clamp FET Q3P. Depending on what output signal the particular conductive channel gives to the common output node S, the potential of collector K2 can be between positive potential $V_{DD}$ and negative potential $V_{SS}$ of the operating voltage source. If the analog signal on the input side has an overvoltage toward the negative side, emitter E has a potential which is more negative than $V_{SS}$.

For the sake of clarity, positive potential $V_{DD}$ is shown in FIGS. 2, 3, 5 and 6 as ⊕, negative potential $V_{SS}$ as ⊖, an over voltage toward the positive side as ⊕⊕ and an overvoltage toward the negative side as ⊖⊖. In the case of a negative overvoltage which is lower than $V_{SS}$ by at least the forward voltage of an emitter-to-base diode, the emitter-to-base diode of the parasitic bipolar transistor is conductive in FIG. 5. Since collector K1 is on positive potential $V_{DD}$, bipolar transistor E-B-K1 is highly conductive. Even if a potential occurs at collector K2 which makes bipolar transistor E-B-K2 conductive, virtually no current is left for collector K2, since the potential of collector K1 is at most as positive as that of collector K1. Since the collector zone of collector K1 is closer to emitter E than the collector zone of collector K2 and the current amplification of a bipolar transistor is higher the shorter the base zone between the emitter and collector is, collector K1 in any case draws a much higher current than collector K2. Collector K1 steals the current from collector K2, so to speak.

Figure 6:
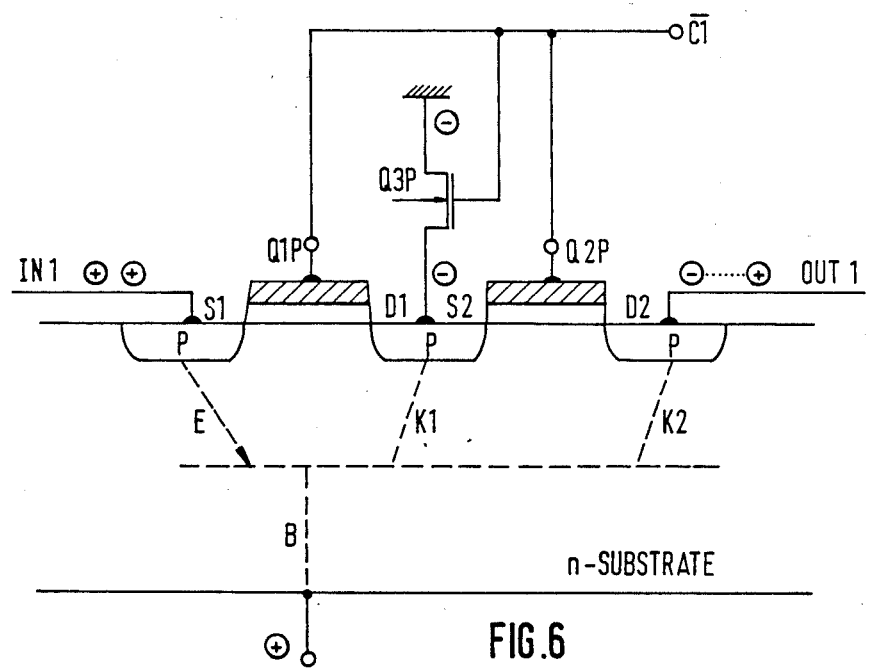
FIG. 6 shows a sectional structure of the two upper series-connected p-channel FETs of FIG. 4 with a parasitic bipolar structure.

Analogous considerations apply to the semiconductor structure shown in FIG. 6 for the two series-connected p-channel FETs Q1P and Q2P of the upper signal path in FIG. 4. In the case of a positive overvoltage at the emitter, bipolar transistor E-B-K1 becomes highly conductive, while bipolar transistor E-B-K2 can carry virtually no collector current because its potential is generally more positive than that of collector K1, at most equally high, and because the collector zone of collector K2 is further away from emitter E than the collector zone of collector K1.

Disturb signals which occur at the output of a nonconductive switch means in known circuits in the case of an overvoltage on the input side are virtually eliminated by the inventive measures since the disturbing effects of conductive parasitic bipolar structures are kept away from the output of the switch means.

Figure 1:
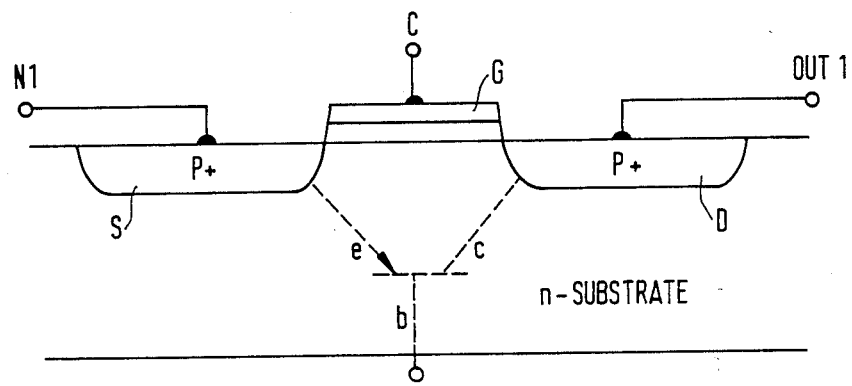
Figure 8:
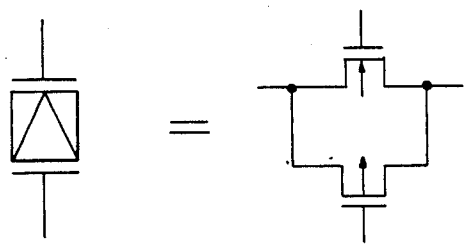
FIG. 8 shows a CMOS switch of the type shown symbolically in FIG. 7.

FIG. 7 shows an embodiment of the invention in which the switch means of each channel has only one signal path which possesses the series connection of three switches, each represented by a symbol meaning a parallel connection of two complementary FETs, as shown in FIG. 8.

With respect to the diode protection network, the embodiment of FIG. 7 corresponds to the embodiment shown in FIG. 4.

Between first pair Q1 of complementary FETs and second pair Q2 of complementary FETs there is a node N2 which is connected via a first clamp FET Q3 to positive potential $V_{DD}$ of the operating voltage source. Between second pair Q2 of complementary FETs and third pair Q4 of complementary FETs there is a second node N3 which is connected via a second clamp FET Q5 to negative potential $V_{SS}$ of the operating voltage source. The n-channel FETs of transistor pairs Q1 and Q2 are protected with the aid of first clamp FET Q3 from the results of negavtive overvoltages on the input side in the way that was explained with reference to FIG. 5. The p-channel FETs of transistor pairs Q2 and Q4 are protected with the aid of second clamp FET Q5 from the effects of positive overvoltages surges on the input side as was explained in connection with FIG. 6. Overvoltages on the input side both in the positive and the negative directions can therefore not exert any disturbing effect on output node N4, which at the same time forms output OUT1 of channel 1.

The individual transistors of the switch means of FIG. 7 are controlled by control signal sources C1 and C1 in the same way as was explained in connection with the embodiment of FIG. 4.

In each of channels 1—n, transistor pairs Q2, Q4 and clamp FETs Q3, Q5 form a protection circuit framed by dashed lines, which prevents disturbing overvoltages on the input side from reaching through to the output of a nonconductive channel.

Particularly good results are obtained with the inventive measures when, in the spatial structure of the integrated circuit with the inventive switch means, the switching points clamped with the clamp FETs are closer to the input possibly exposed to overvoltages than the output point of the switch means.

For some cases of application it may suffice to use for each channel only the upper or the lower signal path of the switch means shown in FIG. 4, in accordance with the circuit shown in FIG. 2 of European Pat. No. A1-0091265. Departing from this known circuit, however, the conductivity type of the clamp FET must, according to the invention, be opposite the conductivity type of the series-connected FETs forming the signal path, and the clamp FET cooperating with the p-channel FETs must be connected to the negative potential of the operating voltage source and the clamp FET cooperating with the n-channel FET must be connected to the positive potential thereof.

I claim:

1. In a switch means designed as an integrated circuit comprising: a signal input connected to a first controllable switch in the form of a first FET which switches off completely only within a predetermined input voltage range and which, upon receiving a control signal connects through an input signal;
   a second controllable switch in the form of a second FET connected between the first FET and an output of the switch means, said second FET being controlled in synchronism with the first FET; and,
   a third FET, serving as a clamp FET, connected between the common node of said first and second FETs and a point of constant voltage, said third FET in the conductive state clamping the node between the first FET and the second FET at the constant voltage and being switched in time synchronism with the first FET and the second FET to a state opposite that of the first FET and the second FET; the improvement wherein:
   the first FET and the second FET are of the same conductivity type and the third FET is of the opposite conductivity type;
   the gate electrodes of all of the first, second and third FETs are driven by control signals of the same polarity; and
   the point of constant voltage is the negative pole of an operating voltage source for the switch means if the third FET is of the n-channel type, and is the positive pole of the operating voltage source if the third FET is of the p-channel type.

2. A switch means according to claim 1, wherein the input of the switch means is connected to an overvoltage protection circuit.

3. A switch means according to claim 1, wherein two parallel signal paths, each having a respective said first FET, a respective said second FET and a respective said third FET, are connected between the input and the output of the switch means; and
   wherein the respective first FET and the respective second FET are formed by p-channel FETs and the respective third FET by an n-channel FET in one of said two signal paths, and the respective first FET and the respective second FET are formed by n-channel FETs and the respective third FET by a p-channel FET in the other of said two signal paths.

4. A switch means according to claim 3, wherein:
   two control signal sources for producing respectively complementary control signals are provided: and
   the control electrodes of the respective first, second and third FETs of one of said two signal paths are connected to one of said control signals sources, and the control electrodes of the respective first, second and third FETs of the other of said two signal paths are connected to the other of said two control signal sources.

5. A switch means according to claim 2 wherein said overvoltage protection circuit includes: a pair of series connected diodes connected between the positive and negative poles of the operating voltage source, with the point of common connection of said pair of diodes being connected to said signal input of said switch means.

6. A switch means according to claim 1, wherein all FETs are formed by MOS FETs.

7. A switch means according to claim 3, wherein all FETs are formed by MOS FETs.

8. A multiplexer having a plurality of signal channels with a respective controlled switch means in the form of an integrated circuit in each channel and with an output node common to all channels, wherein each of said switch means comprises:
   first and second FETs of the same conductivity type connected in series between a signal input and said common output node;
   a third FET of a conductivity type opposite that of said first and second FETs, said third FET being connected between the common node of said first and second FETs and a point of reference potential corresponding to one of the poles of a source of operating voltage for said switch means, and clamping said node to said reference potential when said third FET is conductive, and said third FET being a p-channel FET when said reference potential is the positive operating voltage and being an n-channel FET when said reference potential is the negative operating voltage; and
   control signal means for synchronously applying control pulses of the same polarity to the control electrodes of each of said first, second and third FETs to switch said FETs between conductive and non-conductive states.

9. A multiplexer according to claim 8, wherein an analog-to-digital converter is connected to the common output node.

10. A multiplexer having a plurality of signal channels with a respectively controlled switch means in the form of an integrated circuit in each channel and with an output node common to all channels, wherein each of said switch means comprises:
  first and second FETs of the p-channel type connected in series between a signal input and said common output node;
  a third FET of the n-channel type connected between the common node of said first and second FETs and a point of a first potential corresponding to the negative pole of a source of operating voltage for said switch means, and clamping said node at said first potential when said third FET is conductive;
  fourth and fifth FETs of the n-channel type connected in series between said input and said common output node;
  a sixth FET of the p-channel type connected between the common node of said fourth and fifth FETs and a point of second potential corresponding to the positive pole of the source of operating voltage, and clamping said node of said fourth and fifth FETs at said second potential when said sixth FET is conductive; and
  control signal means for synchronously applying control pulses of one polarity to the control electrodes of each of said first, second and third FETs and control pulses of the opposite polarity to the control electrodes of each of said fourth, fifth and sixth FETs to switch said FETs between conductive and non-conductive states.

11. A multiplexer according to claim 10, wherein an analog-to-digital converter is connected to the common output node.

12. A multiplexer having a plurality of channels with a respective controlled switch means in the form of an integrated circuit in each channel and with an output node common to all channels, wherein each of said switch means comprises:
  first, second and third pairs of parallelly connected complementary FETs connected sequentially in series between a signal input and said common output node;
  a first clamp FET connected between the common node of said first and second pairs of parallelly connected complementary transistors and a point of first potential corresponding to one of the positive and negative poles of an operating voltage source for said switch means, said first clamp FET clamping said node of said first and second pairs to said first potential when in a conductive state;
  a second clamp FET connected between the common node of said second and third pairs of parallelly connected complementary FETs and a point of second potential corresponding to the other of said positive and negative poles of the operating voltage source, said second clamp FET clamping said node of said second and third pairs to said second potential when in a conductive state;
  the one of said first and second clamp FETs connected to said positive pole being a p-channel FET and the other of said first and second clamp FETs being an n-channel FET; and
  control signal means connected to the gate electrodes of all of said FETs for synchronously switching said FETs of said pairs between conductive and non-conductive states, and said first and second clamp FETs between non-conductive and conductive states, respectively 13. A multiplexer according to claim 12, wherein an analog-to-digital converter is connected to the common output node.

14. A switch means designed as an integrated circuit for switching a signal within a predetermined input voltage range comprising:
  a signal input and a signal output;
  first, second and third pairs of parallelly connected complementary FETs connected sequentially in series between said signal input and said signal output;
  a first clamp FET connected between the common node of said first and second pairs of parallelly connected complementary transistors and a first potential corresponding to one of the positive and negative ends of said predetermined input voltage range, said first clamp FET clamping said node of said first and second pairs to said first potential when in a conductive state;
  a second clamp FET connected between the common node of said second and third pairs of parallelly connected complementary FETs and a second potential corresponding to the other of said positive and negative ends of said predetermined input voltage range, said second clamp FET clamping said node of said second and third pairs to said second potential when in a conductive state;
  the one of said first and second clamp FETs connected to the potential corresponding to said positive end of said input voltage range being a p-channel FET and the other of said first and second clamp FETs being an n-channel FET; and
  control signals means connected to the gate electrodes of all of said FETs for synchronously switching said FETs of said pairs between conductive and non-conductive states, and said first and second clamp FETs between non-conductive and conductive states, respectively.

15. A switch means according to claim 14, wherein:
  said control signal means comprises two control signal sources for producing respectively complementary control signals;
  the control electrodes of the FETs of one conductivity type of each of said first, second and third pairs are all connected to one of said two control signal sources, and the control electrodes of the FETs of the other conductivity type of each of said first, second and third pairs are all connected to the other of said two control signal sources; and
  the control electrode of each said first and second clamp FETs is connected to a respectively different one of said two control signal sources.

16. A switch means according to claim 14, wherein all FETs are formed by MOS FETs.

17. A switch means according to claim 14 wherein said first potential corresponds to said positive end of said predetermined input voltage range.

18. A switch means according to claim 17 wherein said first and second potentials correspond to the respective poles of an operating voltage source for said integrated circuit.

19. A controllable integrated switching circuit for switching an input signal on and off comprising:
  first and second FETs of the same conductivity type connected in series between a signal input and a signal output; a third FET of a conductivity type opposite that of said first and second FETs, with said third FET being connected between the common node of said first and second FETs and a point of reference potential corresponding to one of the poles of a source of operating voltage for said circuit, and clamping said node to said reference potential when said third FET is conductive, and with said third FET being a p-channel FET when said reference potential is the positive operating voltage and being an n-channel FET when said reference potential is the negative operating voltage; and control signal means for synchronously applying control pulses of the same polarity to the control electrodes of each of said first, second and third FETs to switch said FETs between conductive and non-conductive states.

20. A controllable integrated switch circuit according to claim 19 further comprising an overvoltage protection circuit means, including a protective diode network, connected to said signal input for protecting said switching circuit from excess voltages.

* * * * *